(12) United States Patent
Qi et al.

(10) Patent No.: US 12,261,259 B2
(45) Date of Patent: Mar. 25, 2025

(54) LIGHT-EMITTING CHIP AND LIGHT-EMITTING SUBSTRATE

(71) Applicants: BOE MLED Technology Co., Ltd., Beijing (CN); BOE Technology Group Co., Ltd., Beijing (CN)

(72) Inventors: Linxia Qi, Beijing (CN); Junjie Ma, Beijing (CN); Yuanda Lu, Beijing (CN); Shanwei Yang, Beijing (CN); Jiawei Zhao, Beijing (CN); Zhijun Xiong, Beijing (CN); Haiwei Sun, Beijing (CN); Lingyun Shi, Beijing (CN); Jinpeng Li, Beijing (CN)

(73) Assignees: BOE MLED Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 597 days.

(21) Appl. No.: 17/481,326

(22) Filed: Sep. 22, 2021

(65) Prior Publication Data
US 2022/0254969 A1    Aug. 11, 2022

(30) Foreign Application Priority Data
Feb. 7, 2021    (CN) .......................... 202110178736.8

(51) Int. Cl.
  *H01L 21/00*    (2006.01)
  *H01L 25/075*    (2006.01)
  *H01L 33/38*    (2010.01)
  *H01L 33/62*    (2010.01)

(52) U.S. Cl.
  CPC .......... *H01L 33/62* (2013.01); *H01L 25/0753* (2013.01); *H01L 33/382* (2013.01)

(58) Field of Classification Search
  CPC .... H01L 33/62; H01L 33/382; H01L 25/0753
  See application file for complete search history.

(56) References Cited

U.S. PATENT DOCUMENTS

| 9,666,564 B2 * | 5/2017 | Lai .................. H01L 25/0753 |
| 2005/0195589 A1 * | 9/2005 | Sung ..................... G09G 3/342 |
| | | 362/613 |
| 2021/0134767 A1 * | 5/2021 | Wang ..................... H01L 33/60 |

FOREIGN PATENT DOCUMENTS

| CN | 202917531 U | 5/2013 |
| CN | 211062719 U | 7/2020 |
| CN | 111987200 A | 11/2020 |
| CN | 112154540 A | 12/2020 |

OTHER PUBLICATIONS

Office Action dated Jan. 24, 2025 for CN202110178736.8 and English Translation.

* cited by examiner

*Primary Examiner* — Richard A Booth
(74) *Attorney, Agent, or Firm* — Ling Wu; Stephen Yang; Ling and Yang Intellectual Property

(57) ABSTRACT

A light-emitting chip and a light-emitting substrate are provided. The light-emitting chip includes a base substrate and at least two sub-light-emitting chips disposed on a side of the base substrate, wherein each sub-light-emitting chip includes a first semiconductor layer, a second semiconductor layer and an light-emitting layer located between the first semiconductor layer and the second semiconductor layer which are stacked.

12 Claims, 7 Drawing Sheets

LIGHT-EMITTING CHIP AND LIGHT-EMITTING SUBSTRATE

CROSS-REFERENCE TO RELATED APPLICATION

The present application claims priority of Chinese Patent Application No. 202110178736.8 filed to the CNIPA on Feb. 7, 2021, the content of which is incorporated herein by reference.

TECHNICAL FIELD

The embodiments of the present disclosure relate to the field of display technology, in particular to a light-emitting chip and a method for manufacturing the light-emitting chip, and a light-emitting substrate.

BACKGROUND

Due to advantages of simple structure, small size, energy saving, high efficiency, long service life and clear light, in recent years, light-emitting diodes (LEDs) have gradually replaced conventional lightings such as incandescent lamps and fluorescent lamps, and are becoming a mainstream product in a new generation lighting market, and are also widely applied in photoelectric systems.

With a rise of Mini LED industry, how to improve module performance has become a goal pursued by many people. According to different forms of modules, Mini LED may be divided into two technical implementation forms: back light and display module. Among them, a light-emitting chip serves as a basic light-emitting unit, and its performance directly affects the product performance.

A single conventional light-emitting chip needs to operate at a high current density to obtain large optical power, in this case, the device efficiency will suffer from a serious droop effect, leading to a decrease in its emitting efficiency.

SUMMARY

The following is a summary of the subject matters described in the present disclosure in detail. The summary is not intended to limit the scope of protection of the claims.

In a first aspect, an embodiment of the present disclosure provides a light-emitting chip, which includes a base substrate and at least two sub-light-emitting chips disposed on a side of the base substrate, wherein each sub-light-emitting chip includes a first semiconductor layer, a second semiconductor layer and a light-emitting layer located between the first semiconductor layer and the second semiconductor layer, which are stacked.

In an exemplary embodiment, the at least two sub-light-emitting chips are connected in series to form a series group of sub-light-emitting chips, and the light-emitting chip further includes a first electrode and a second electrode, the first electrode is connected to a sub-light-emitting chip at a first terminal of the series group of sub-light-emitting chips and the second electrode is connected to a sub-light-emitting chip at a second terminal of the series group of sub-light-emitting chips.

In an exemplary embodiment, the sub-light-emitting chip further includes a first electrode and a second electrode, wherein the first electrode is connected to the first semiconductor layer of the sub-light-emitting chip and the second electrode is connected to the second semiconductor layer of the sub-light-emitting chip.

In an exemplary embodiment, a vertical projection of any one of the sub-light-emitting chips in the series group of sub-light-emitting chips on the base substrate overlaps with a vertical projection of at least one of the first electrode and the second electrode on the base substrate.

In an exemplary embodiment, in a direction parallel to the base substrate, the sub-light-emitting chips in the series group of sub-light-emitting chips are arranged side by side along a first direction of the base substrate; or, the sub-light-emitting chips are arranged in a triangle; or, the sub-light-emitting chips are disposed in a rectangle.

In an exemplary embodiment, the light-emitting substrate further includes a series electrode disposed on a side of the base substrate, wherein a first terminal of the series electrode is connected to the first semiconductor layer of one of adjacent sub-light-emitting chips, and a second terminal of the series electrode is connected to the second semiconductor layer of the other one of the adjacent sub-light-emitting chips.

In an exemplary embodiment, in a direction perpendicular to the base substrate, a first insulating layer is disposed between the first terminal of the series electrode and the second semiconductor layer of one of the adjacent sub-light-emitting chips; and/or the first insulating layer is disposed between the second terminal of the series electrode and the first semiconductor layer of the other one of the adjacent sub-light-emitting chips.

In an exemplary embodiment, in a direction perpendicular to the base substrate, the first electrode and the second electrode are located on a side of the second semiconductor layer away from the light-emitting layer, and a second insulating layer is disposed between the first and second electrodes and the second semiconductor layer; the second insulating layer is provided with a first via hole exposing a sub-light-emitting chip at the first terminal of the series group of sub-light-emitting chips and a second via hole exposing a sub-light-emitting chip at the second terminal of the series group of sub-light-emitting chips; the first electrode is connected to the sub-light-emitting chip at the first terminal of the series group of sub-light-emitting chips through the first via hole, and the second electrode is connected to the sub-light-emitting chip at the second terminal of the series group of sub-light-emitting chips through the second via hole.

In an exemplary embodiment, the second insulating layer is made of a reflective material.

In an exemplary embodiment, the sub-light-emitting chips are rectangular or triangular.

In a second aspect, an embodiment of the present disclosure provides a light-emitting substrate including a drive back plate and a light-emitting chip disposed on a side of the drive back plate, the light-emitting chip including: a base substrate and at least two sub-light-emitting chips disposed on a side of the base substrate, wherein each sub-light-emitting chip includes a first semiconductor layer, a second semiconductor layer and a light-emitting layer disposed between the first semiconductor layer and the second semiconductor layer which are stacked; the sub-light-emitting chip further includes a first electrode and a second electrode, wherein the first electrode is connected to the first semiconductor layer of the sub-light-emitting chip and the second electrode is connected to the second semiconductor layer of the sub-light-emitting chip.

In an exemplary embodiment, the drive back plate is provided with pad units, and the pad units include multiple pad groups connected in series, wherein the sub-light-emitting chips in the light-emitting chip are in one-to-one correspondence with the pad groups, and the sub-light-emitting chips in the light-emitting chip are connected to the pad groups.

In an exemplary embodiment, the pad group includes a first pad and a second pad which are oppositely disposed, the first electrode in the sub-light-emitting chip is connected to the first pad, and the second electrode in the sub-light-emitting chip is connected to the second pad.

In an exemplary embodiment, the pad units are disposed side by side along a first direction of the drive back plate to form a pad unit row, and the pad units in the pad unit row are connected in series.

In an exemplary embodiment, the drive back plate is provided thereon with a first lead and a second lead, wherein the first lead is connected to a pad unit at a first terminal of the pad unit row, and the second lead is connected to a pad unit at a second terminal of the pad group row.

In a third aspect, an embodiment of the present disclosure provides a light-emitting substrate, including a drive back plate and a light-emitting chip disposed on a side of the drive back plate, wherein the light-emitting chip includes a base substrate and at least two sub-light-emitting chips disposed on a side of the base substrate, and each sub-light-emitting chip includes a first semiconductor layer, a second semiconductor layer and a light-emitting layer between the first semiconductor layer and the second semiconductor layer which are stacked; wherein the at least two sub-light-emitting chips are connected in series to form a series group of sub-light-emitting chips, and the light-emitting chip further includes a first electrode and a second electrode, the first electrode is connected to a sub-light-emitting chip at a first terminal of the series group of sub-light-emitting chips and a second electrode connected to a sub-light-emitting chip at a second terminal of the series group of sub-light-emitting chips.

In an exemplary embodiment, a vertical projection of any one of the sub-light-emitting chips in the series group of sub-light-emitting chips on the base substrate overlaps with a vertical projection of at least one of the first electrode and the second electrode on the base substrate.

In an exemplary embodiment, in a direction parallel to the base substrate, the sub-light-emitting chips in the series group of sub-light-emitting chips are arranged side by side along a first direction of the base substrate; or, the sub-light-emitting chips are arranged in a triangle; or, the sub-light-emitting chips are disposed in a rectangle.

In an exemplary embodiment, the light-emitting substrate further includes a series electrode disposed on a side of the base substrate, wherein a first terminal of the series electrode is connected to the first semiconductor layer of one of adjacent sub-light-emitting chips, and a second terminal of the series electrode is connected to the second semiconductor layer of the other one of the adjacent sub-light-emitting chips.

In an exemplary embodiment, in a direction perpendicular to the base substrate, the first electrode and the second electrode are located on a side of the second semiconductor layer away from the light-emitting layer, and a second insulating layer is disposed between the first and second electrodes and the second semiconductor layer; the second insulating layer is provided with a first via hole exposing the sub-light-emitting chip at the first terminal of the series group of sub-light-emitting chips and a second via hole exposing the sub-light-emitting chip at a second terminal of the series group of sub-light-emitting chips; the first electrode is connected to the sub-light-emitting chip at the first terminal of the series group of sub-light-emitting chips through the first via hole, and the second electrode is connected to the sub-light-emitting chip at the second terminal of the series group of sub-light-emitting chips through the second via hole. Of course, an implementation of any product or method in the embodiments of the present disclosure does not need to achieve all the advantages mentioned above at the same time. Other features and advantages of the present disclosure will be set forth in the following embodiments of the description, and in part will become apparent from the embodiments of the description, or be learned by practice of the present disclosure. Purposes and other advantages of the technical solutions of the present disclosure may be achieved and acquired by structures specified in the detailed description, claims and drawings.

Other aspects may be comprehended upon reading and understanding of the drawings and the detailed descriptions.

BRIEF DESCRIPTION OF DRAWINGS

The drawings provide a further understanding of technical solutions of the present disclosure, form a part of the specification, and are used to explain, together with the embodiments of the present disclosure, the technical solutions of the present disclosure and not intended to form limitations on the technical solutions of the present disclosure. The shape and size of each component in the drawings do not reflect true scales and only to be used to schematically illustrate contents of the present disclosure.

DETAILED DESCRIPTION

Specific implementations of the present disclosure will be described further in detail below with reference to the accompanying drawings and embodiments. The following embodiments serve to illustrate the present disclosure, but are not intended to limit the scope of the present disclosure. It is to be noted that the embodiments in the disclosure and features in the embodiments may be combined with each other if there is no conflict.

Figure 1:
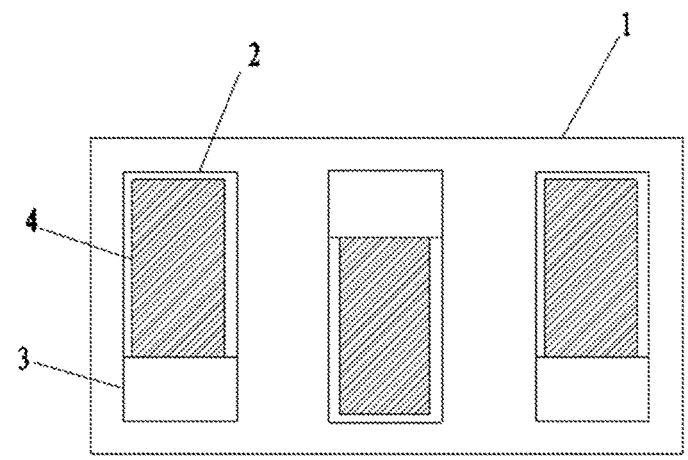
FIG. 1 is a first schematic diagram of a structure of a light-emitting chip according to an embodiment of the present disclosure.

FIG. 1 is a schematic diagram of a structure of a light-emitting chip according to an embodiment of the present disclosure. As shown in FIG. 1, the light-emitting chip includes a base substrate 1 and at least two sub-light-emitting chips 2 disposed on a side of the base substrate 1, wherein a sub-light-emitting chip 2 includes a first semiconductor layer 3 and a second semiconductor layer 4 which are stacked and a light-emitting layer (not shown in the Figure) located between the first semiconductor layer 3 and the second semiconductor layer 4. Among them, the base substrate 1 serves as a substrate of the light-emitting chip. An upper step surface and a lower step surface is formed on the sub-light-emitting chip 2, the first semiconductor layer 3 in the sub-light-emitting chip 2 forms lower step surface, and the second semiconductor layer 4 in the sub-light-emitting chip 2 forms an upper step surface. The first semiconductor layer 3 may be an N-type semiconductor layer serving as an electron injection layer, and the second semiconductor layer 4 may be a P-type semiconductor layer serving as a hole injection layer. When a voltage is applied to the sub-light-emitting chip 2, electrons in the first semiconductor layer 3 will migrate to the light-emitting layer and enter the light-emitting layer. Holes in the second semiconductor layer 4 also migrate to the light-emitting layer and enter the light-emitting layer. Electrons entering the light-emitting layer recombine with holes, thus generating spontaneous radiation light. Exemplarily, the light-emitting layer may be a Multiple Quantum Well (MQW) layer. The base substrate 1 is configured to grow a semiconductor layer and a light-emitting layer, for example, the base substrate 1 may be a sapphire substrate.

In the light-emitting chip according to the embodiment of the present disclosure, at least two sub-light-emitting chips 2 form a light-emitting chip, which can greatly reduce costs of assembling parts, reduce currents of lines and reduce power consumption.

The technical solution of the light-emitting chip of the present disclosure is described in detail below through specific embodiments.

Figure 2:
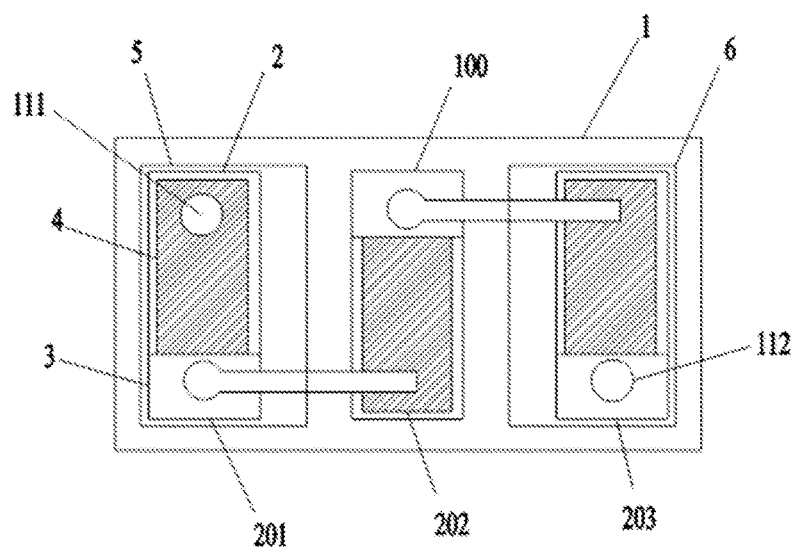
FIG. 2 is a second schematic diagram of a structure of a light-emitting chip according to an embodiment of the present disclosure.

FIG. 2 is a second schematic diagram of a structure of a light-emitting chip according to an embodiment of the present disclosure. A light-emitting chip including three sub-light-emitting chips is taken as an example. As shown in FIG. 2, the light-emitting chip of the embodiment of the present disclosure includes a base substrate 1 and three sub-light-emitting chips 2 disposed on a side of the base substrate 1. In a direction perpendicular to the base substrate 1, each sub-light-emitting chip 2 includes a first semiconductor layer 3 and a second semiconductor layer 4 which are stacked and a light-emitting layer (not shown in the figure) located between the first semiconductor layer 3 and the second semiconductor layer 4. In a direction parallel to the base substrate 1, the sub-light-emitting chips 2 are rectangular and have a same size. Exemplarily, the rectangle includes an approximate rectangle, for example, a rectangle with rounded corners. The three sub-light-emitting chips 2, namely a first sub-light-emitting chip 201, a second sub-light-emitting chip 202 and a third sub-light-emitting chip 203, are arranged along a first direction of the base substrate 1, and the three sub-light-emitting chips 2 are connected in series to form a series group 100 of sub-light-emitting chips, that is, the first semiconductor layer 3 in the first sub-light-emitting chip 201 is electrically connected to the second semiconductor layer 4 in the second sub-light-emitting chip 202; and the first semiconductor layer 3 in the second sub-light-emitting chip 202 is electrically connected to the second semiconductor layer 4 in the third sub-light-emitting chip 203. The light-emitting chip further includes a second insulating layer (not shown in the figure) located on a side of the second semiconductor layer 4 away from the base substrate 1, and a first electrode 5 and a second electrode 6 which are located on a side of the second insulating layer away from the base substrate 1. In an exemplary embodiment, the second insulating layer 11 may cover a surface of the second semiconductor layer 4 and part of a surface of the first semiconductor layer 3 of the sub-light-emitting chip 2. The second insulating layer 11 is provided with a first via hole 111 exposing the sub-light-emitting chips 2 at a first terminal of the series group 100 of sub-light-emitting chips and a second via hole 112 exposing the sub-light-emitting chips 2 at a second terminal of the series group 100 of sub-light-emitting chips, that is, the first via hole 111 exposes the second semiconductor layer 4 in the first sub-light-emitting chip 201 and the second via hole 112 exposes the first semiconductor layer 3 in the third sub-light-emitting chip 203. The first electrode 5 is electrically connected to the second semiconductor layer 4 in the first sub-light-emitting chip 201 through the first via hole 111, and the second electrode 6 is electrically connected to the first semiconductor layer 3 in the third sub-light-emitting chip 203 through the second via hole 112. The first electrode 5 and the second electrode 6 are configured to apply a voltage to the series group 100 of sub-light-emitting chips, so that each sub-light-emitting chip 2 in the series group 100 of sub-light-emitting chips emits light. Among them, the series connection of sub-light-emitting chips 2 means that the first semiconductor layer 3 of one of adjacent sub-light-emitting chips is electrically connected to the second semiconductor layer 4 of the other one of the adjacent sub-light-emitting chips.

Figure 3:
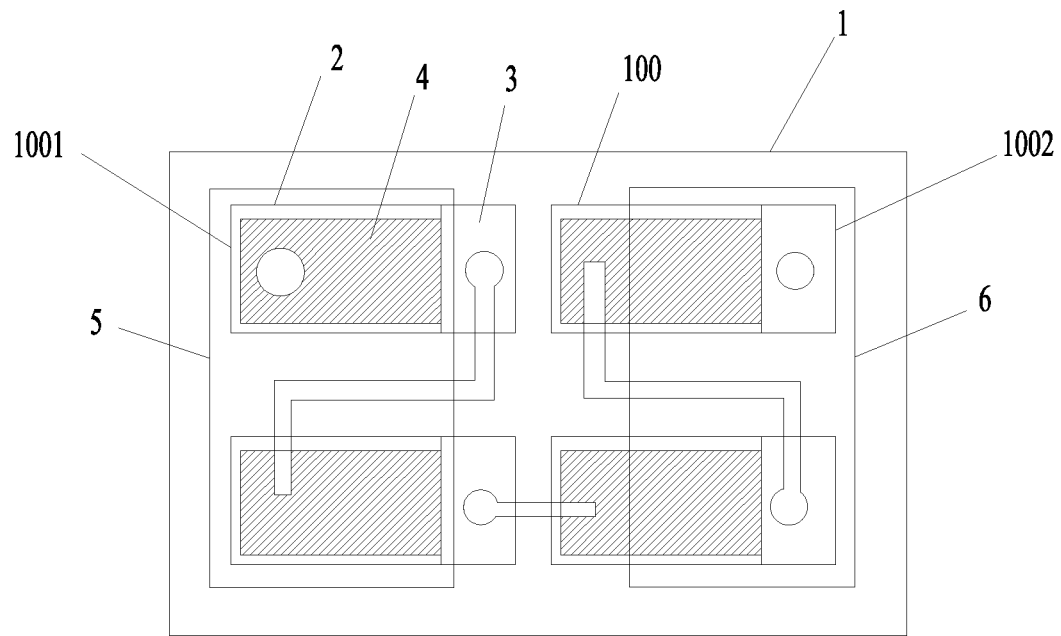
FIG. 3 is a third schematic diagram of a structure of a light-emitting chip according to an embodiment of the present disclosure.

FIG. 3 is a third schematic diagram of a structure of a light-emitting chip according to an embodiment of the present disclosure. A light-emitting chip including four sub-light-emitting chips is taken as an example. As shown in FIG. 3, the light-emitting chip of the embodiment of the present disclosure includes a base substrate 1 and four sub-light-emitting chips 2 disposed on a side of the base substrate 1. In a direction perpendicular to the base substrate 1, each sub-light-emitting chip 2 includes a first semiconductor layer 3, a second semiconductor layer 4 which are stacked and a light-emitting layer (not shown in the figure) located between the first semiconductor layer 3 and the second semiconductor layer 4. In a direction parallel to the base substrate 1, the sub-light-emitting chips 2 are rectangular and have a same size. Exemplarily, the rectangle includes an approximate rectangle, for example, a rectangle with rounded corners. The four sub-light-emitting chips 2 are arranged in a rectangle. Herein, the rectangular arrangement means that connecting lines between geometric centers of the four sub-light-emitting chips 2 form a rectangle. The four sub-light-emitting chips 2 are connected in series to form a series group 100 of sub-light-emitting chips. The light-emitting chip further includes a first electrode 5 and a second electrode 6, wherein the first electrode 5 is connected to the second semiconductor layer 4 in a sub-light-emitting chip 2 at a first terminal 1001 of the series group 100 of sub-light-emitting chips and the second electrode 6 is connected to a first semiconductor layer 3 in a sub-light-emitting chip 2 at a second terminal 1002 of the series group 100 of sub-light-emitting chips.

In some embodiments, the light-emitting chip may also include more than four sub-light-emitting chips, and more than four sub-light-emitting chips are connected in series to form a series group of sub-light-emitting chips, which is not described in detail herein.

According to the embodiment of the present disclosure, at least two sub-light-emitting chips 2 in the light-emitting chip are connected in series, and each sub-light-emitting chip 2 in the series group 100 of sub-light-emitting chips emits light by applying a voltage to the series group 100 of sub-light-emitting chips, so that the light-emitting chip can have high light-emitting efficiency and light output intensity at a low current density, which can greatly reduce costs of assembling parts and decrease currents in the lines.

Use of the light-emitting chip in the embodiment of the disclosure can effectively improve brightness per unit area of a display device, and can effectively reduce use currents, reduce power consumption by about 50% under a same condition, reduce costs of a driver and a back plate, and improve competitiveness of products.

Figure 4:
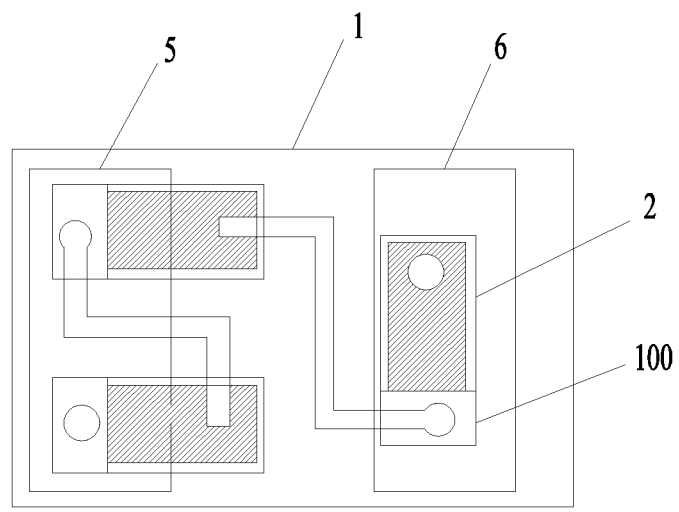
FIG. 4 is a fourth schematic diagram of a structure of a light-emitting chip according to an embodiment of the present disclosure.
Figure 5:
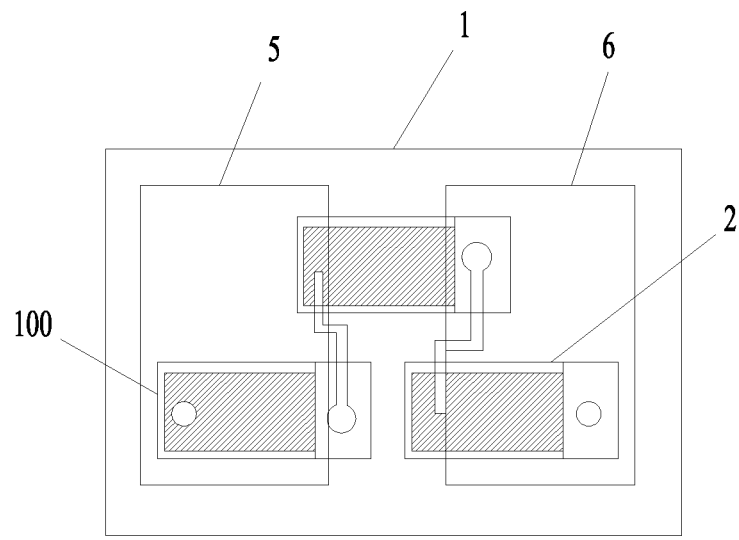
FIG. 5 is a fifth schematic diagram of a structure of a light-emitting chip according to an embodiment of the present disclosure.

FIG. 4 is a fourth schematic diagram of a structure of a light-emitting chip according to an embodiment of the present disclosure. FIG. 5 is a fifth schematic diagram of a structure of a light-emitting chip according to an embodiment of the present disclosure. The light-emitting chip of the embodiment of the present disclosure may include three sub-light-emitting chips 2, and the three sub-light-emitting chips 2 are connected in series to form a series group 100 of sub-light-emitting chips. The sub-light-emitting chips 2 are rectangular and have a same size. Exemplarily, the rectangle includes an approximate rectangle, for example, a rectangle with rounded corners. The three sub-light-emitting chips 2 are arranged in a triangle. Herein, the triangle arrangement means that connecting lines between geometric centers of the three sub-light-emitting chips 2 form a triangle. The light-emitting chip further includes a first electrode 5 and a second electrode 6, wherein the first electrode 5 is connected to a sub-light-emitting chip 2 at a first terminal of the series group 100 of sub-light-emitting chips and the second electrode 6 is connected to a sub-light-emitting chip 2 at a second terminal of the series group 100 of sub-light-emitting chips. A vertical projection of any sub-light-emitting chip 2 in the series group 100 of sub-light-emitting chips on the base substrate 1 overlaps with a vertical projection of at least one of the first electrode 5 and the second electrode 6 on the base substrate 1, so that each sub-light-emitting chip is covered by the first electrode or the second electrode, then the first electrode and the second electrode can dissipate heat for each sub-light-emitting chip and improve a heat dissipation effect of the sub-light-emitting chips, as shown in FIGS. 4 and 5.

Figure 6:
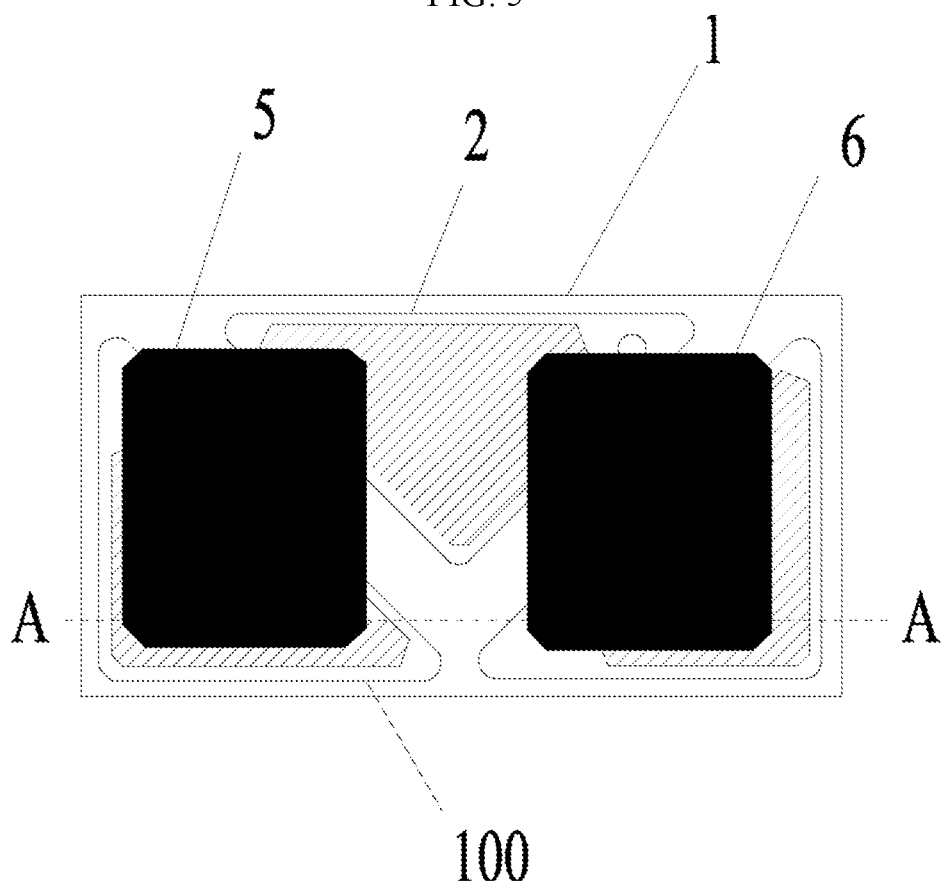
FIG. 6 is a sixth schematic diagram of a structure of a light-emitting chip according to an embodiment of the present disclosure.
Figure 7:
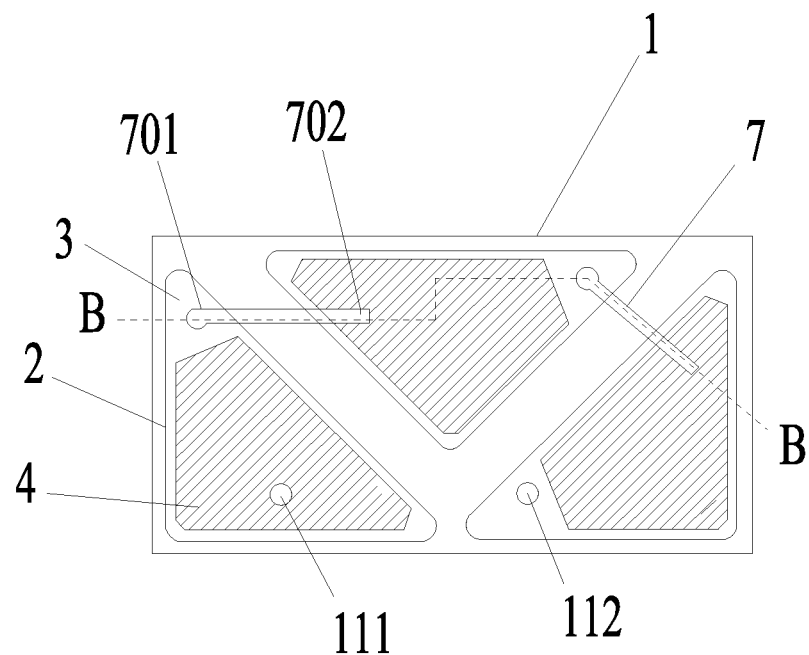
FIG. 7 is a schematic diagram of a structure of a sub-light-emitting chip in a light-emitting chip according to an embodiment of the present disclosure.
Figure 9:
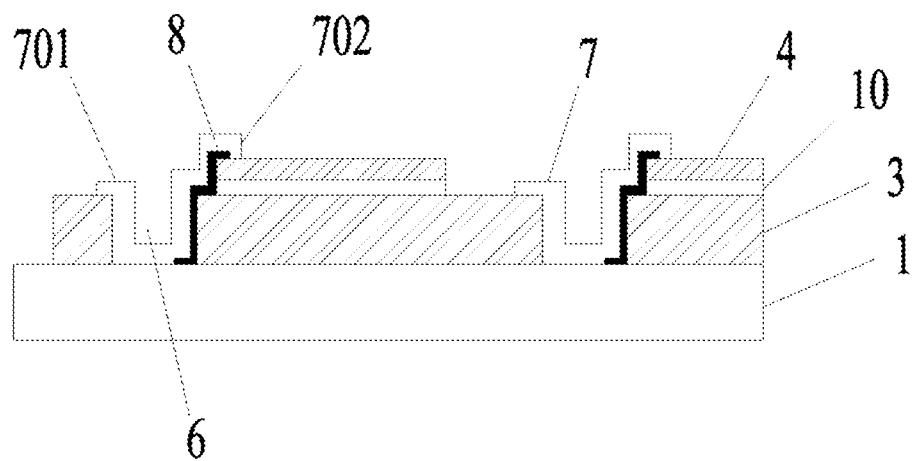
FIG. 9 is a sectional view of a sub-light-emitting chip in a light-emitting chip according to an embodiment of the present disclosure.

FIG. 6 is a sixth schematic diagram of a structure of a light-emitting chip according to an embodiment of the present disclosure; FIG. 7 is a schematic diagram of a structure of a sub-light-emitting chip in a light-emitting chip according to an embodiment of the present disclosure. FIG. 9 is a sectional view of a sub-light-emitting chip in a light-emitting chip according to an embodiment of the present disclosure. The structure of the light-emitting chip of the present disclosure is described by taking an example in which the light-emitting chip includes three sub-light-emitting chips, and FIG. 9 is a sectional view taken along a B-B direction in FIG. 7. As shown in FIG. 6, FIG. 7 and FIG. 9, the light-emitting chip of the embodiment of the present disclosure includes a base substrate 1 and three sub-light-emitting chips 2 disposed on a side of the base substrate 1. The sub-light-emitting chips 2 are triangular and have a same size. Exemplarily, the triangle includes a triangle or a shape similar to a triangle, for example, a triangle with rounded corners. The three sub-light-emitting chips 2 are arranged in a triangle. Herein, the triangle arrangement means that connecting lines between geometric centers of the three sub-light-emitting chips 2 form a triangle. The three sub-light-emitting chips 2 are connected in series to form a series group 100 of sub-light-emitting chips. According to the embodiment of the disclosure, by arranging the sub-light-emitting chips in a triangle, an effective light-emitting area per unit area of the base substrate can be increased. According to the embodiment of the present disclosure, the sub-light-emitting chips are designed into triangles to shorten lengths of series electrodes.

In a direction perpendicular to the base substrate 1 (i.e., a thickness direction of the base substrate 1), the sub-light-emitting chip 2 includes a first semiconductor layer 3 disposed on a side of the base substrate 1, a light-emitting layer 10 disposed on a side of the first semiconductor layer 3 away from the base substrate 1, and a second semiconductor layer 4 disposed on a side of the light-emitting layer 10 away from the base substrate 1. There is a gap between orthographic projections of adjacent sub-light-emitting chips 2 on the base substrate 1, such that the adjacent sub-light-emitting chips 2 are separated from each other. The light-emitting chip of the embodiment of the present disclosure further includes a series electrode 7 disposed on a side of the base substrate 1, wherein the series electrode 7 is configured to connect adjacent sub-light-emitting chips 2 in series. In an exemplary embodiment, a first terminal 701 of the series electrode 7 is connected to the first semiconductor layer 3 of one of the adjacent sub-light-emitting chips 2, and a second terminal 702 of the series electrode 7 is connected to the second semiconductor layer 4 of the other one of the adjacent sub-light-emitting chips 2, thereby achieving a series connection of the sub-light-emitting chips 2.

As shown in FIG. 9, in a direction perpendicular to the base substrate 1, a first insulating layer 8 is disposed between the second terminal 702 of the series electrode 7 and the first semiconductor layer 3 of the other one of adjacent sub-light-emitting chips, wherein the first insulating layer 8 is configured to separate the second terminal 702 of the series electrode 7 from the first semiconductor layer 3 of the other one of the adjacent sub-light-emitting chips, thus avoiding the second terminal 702 of the series electrode 7 from being electrically connected to the first semiconductor layer 3 and the second conductor layer 4 of the other one of the adjacent sub-light-emitting chips at the same time, resulting in a short circuit.

In some embodiments, the first insulating layer is disposed between the first terminal of the series electrode and the second semiconductor layer of one of the adjacent sub-light-emitting chips to separate the first terminal of the series electrode from the second semiconductor layer of one of the adjacent sub-light-emitting chips, thereby avoiding the first terminal of the series electrode from being electrically connected to the first semiconductor layer and the second conductor layer of one of the adjacent sub-light-emitting chips at the same time, resulting in a short circuit.

Figure 8:
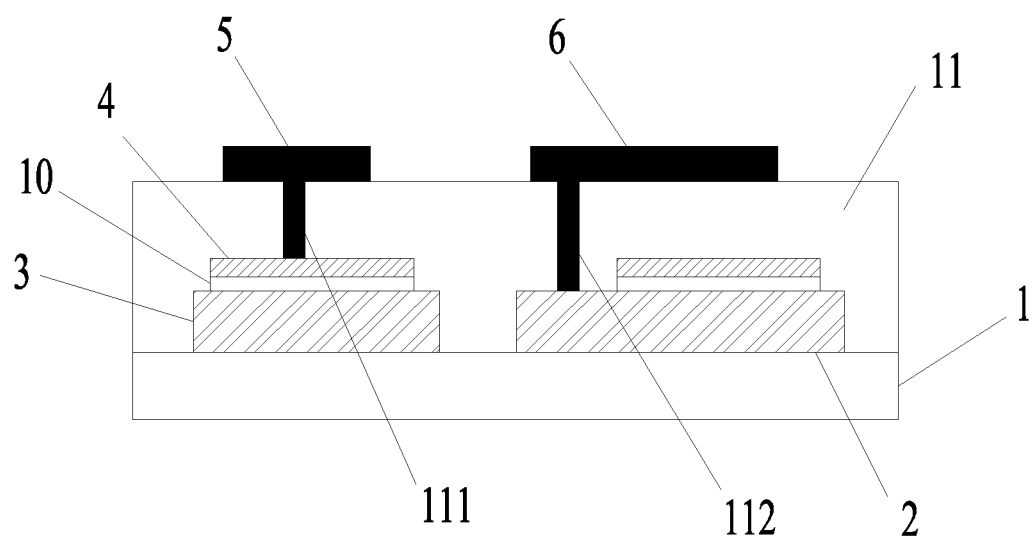
FIG. 8 is a sectional view of a light-emitting chip according to an embodiment of the present disclosure.

FIG. 8 is a sectional view of a light-emitting chip according to an embodiment of the present disclosure. FIG. 8 being a sectional view taken along an A-A direction in FIG. 6 is taken as an example to explain a structure of the light-emitting chip of the present disclosure. As shown in FIGS. 6 and 8, the light-emitting chip further includes a first electrode 5 and a second electrode 6, wherein the first electrode 5 is connected to the second semiconductor layer 4 in a sub-light-emitting chip 2 at a first terminal of the series group 100 of sub-light-emitting chips and the second electrode 6 is connected to the first semiconductor layer 3 in a sub-light-emitting chip 2 at a second terminal of the series group 100 of sub-light-emitting chips.

As shown in FIG. 8, in a direction perpendicular to the base substrate 1, the first electrode 5 and the second electrode 6 are located on a side of the second semiconductor layer 4 away from the light-emitting layer 10. In an exemplary embodiment, a vertical projection of any sub-light-emitting chip 2 in the series group 100 of sub-light-emitting chips on the base substrate 1 overlaps with a vertical projection of at least one of the first electrode 5 and the second electrode 6 on the base substrate 1. For example, as shown in FIG. 6, the vertical projection of the first electrode 5 on the base substrate 1 overlaps with a vertical projection of two sub-light-emitting chips 2 near the first electrode 5 in the series group of sub-light-emitting chips on the base substrate, and the vertical projection of the second electrode 6 on the base substrate 1 overlaps with a vertical projection of two sub-light-emitting chips 2 near the second electrode 6 in the sub-light-emitting chip series group on the base substrate.

In the embodiment of the present disclosure, vertical projections of the first electrode and the second electrode of the light-emitting chip on the base substrate overlap with a vertical projection of each sub-light-emitting chip in the series group of sub-light-emitting chips on the base substrate, so that each sub-light-emitting chip is cover by the first electrode or the second electrode, then the first electrode and the second electrode can dissipate heat for each sub-light-emitting chip and improve a dissipation effect of the sub-light-emitting chips.

In an exemplary embodiment, materials of the first electrode and the second electrode may have relatively high thermal conductivity, for example, they are metal electrodes, and the metal electrodes also have high reflectivity, which helps to improve light efficiency.

As shown in FIG. 8, in a direction perpendicular to the base substrate 1, a second insulating layer 11 is disposed between the first and second electrodes 5 and 6 and the second semiconductor layer 4, and the second insulating layer 11 is configured to separate the first and second electrodes 5 and 6 from the second semiconductor layer 4 and to separate adjacent sub-light-emitting chips 2. In an exemplary embodiment, the second insulating layer 11 may cover a surface of the second semiconductor layer 4 and part of a surface of the first semiconductor layer 3 of the sub-light-emitting chip 2. The second insulating layer 11 is provided with a first via hole 111 exposing a sub-light-emitting chip 2 at a first terminal of the series group 100 of sub-light-emitting chips and a second via hole 112 exposing a sub-light-emitting chip 2 at a second terminal of the series group 100 of sub-light-emitting chips, that is, the first via hole 111 exposes the second semiconductor layer 4 in the first sub-light-emitting chip 201 and the second via hole 112 exposes the first semiconductor layer 3 in the third sub-light-emitting chip 203. The first electrode 5 is electrically connected to the second semiconductor layer 4 in the first sub-light-emitting chip 201 through the first via hole 111, and the second electrode 6 is electrically connected to the first semiconductor layer 3 in the third sub-light-emitting chip 203 through the second via hole 112. In an exemplary embodiment, the second insulating layer 11, the first electrode 5 and the second electrode 6 may be made of a reflective material, so as to improve a light-emitting efficiency of the sub-light-emitting chips 2. For example, a material of the first electrode and the second electrode may be metal.

The sub-light-emitting chips are designed into triangles in the embodiment of the present disclosure to shorten lengths of the series electrodes and avoid an accumulation of the series electrodes at an upper step surface and a lower step surface of a sub-light-emitting chip which results in a heat accumulation and an electric leakage. The reason is as follows: the calculation formula of resistance is:

$$R = \rho \frac{L}{S}$$

In which R is resistance, $\rho$ is resistivity, L is a length along which a current flows, and S is a cross section through which the current flows. The series electrode has an upslope structure at the upper step surface and the lower step surface of the sub-light-emitting chip, and the series electrode is narrow. When the length L increases, the resistance will increase. Under a condition of a same current in the series structure, the series electrode will easily accumulate more heat, which affects reliability of the light-emitting chip. According to the Shorckley theory, under an action of a forward low voltage and a reverse voltage, a current of LED is very small, and a reverse saturation current density of the LED is generally smaller than $10^{-20}$ A/cm$^2$, which is almost negligible. However, actual measurement shows that a current may reach $10^{-9}$-$10^{-5}$ A/cm$^2$ or even larger under the condition of low forward voltage and the reverse voltage of LED, and these "excessive currents" are generally called "leakage currents". Leakage currents will affect photoelectric conversion efficiency of the LED and reduce reliability of devices. In actual use, it is found that the light-emitting chip has obvious leakage under a small voltage, which leads to failure of the light-emitting chip. Therefore, heat dissipation performance of the light-emitting chip is improved and reduction of risks of the leakage plays an important role in ensuring performance of the light-emitting chip.

Light-emitting efficiency and light pattern of the light-emitting chip directly affect brightness of the light-emitting device and brightness uniformity at different viewing angles. Through lightools simulation, it may be concluded that when at least two sub-light-emitting chips are arranged in triangle or rectangle, light patterns of the light-emitting chips are more symmetrical. Compared with at least two sub-light-emitting chips arranged in only one direction, brightness of the light-emitting chips in different viewing angles is uniform and consistent, thus improving the brightness uniformity at different viewing angles.

According to the embodiment of the disclosure, the sub-light-emitting chips are disposed in a triangle to ensure that each sub-light-emitting chip is covered by the first electrode and the second electrode, and thus the heat dissipation performance of the sub-light-emitting chips is improved, and the risk of leakage is reduced. The light pattern of the sub-light-emitting chips obtained is a Lambert reflector, so that the brightness of the sub-light-emitting chips in each direction is the same, the brightness uniformity at different viewing angles is improved, and the forward emitting intensity is improved by about 10%. In addition, when the series group of sub-light-emitting chips in the present disclosure includes three sub-light-emitting chips, the sub-light-emitting chips are configured to be disposed in a triangle to make full use of the space on the base substrate and increase an effective light-emitting area per unit area on the base substrate, thereby improving the light-emitting efficiency of the light-emitting chip and shortening lengths of the series electrodes.

Figure 10:
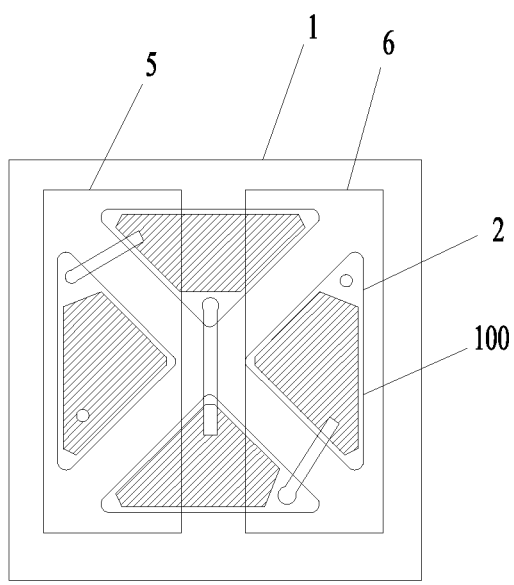
FIG. 10 is a seventh schematic diagram of a structure of a light-emitting chip according to an embodiment of the present disclosure.

FIG. 10 is a seventh schematic diagram of a structure of a light-emitting chip according to an embodiment of the present disclosure. The light-emitting chip including four sub-light-emitting chips is taken as an example. As shown in FIG. 10, the light-emitting chip of the embodiment of the present disclosure includes a base substrate 1 and four sub-light-emitting chips 2 disposed on a side of the base substrate 1. The sub-light-emitting chips 2 are triangular and have a same size. Exemplarily, the triangle includes a triangle or a shape similar to a triangle, for example, a triangle with rounded corners. The four sub-light-emitting chips 2 are arranged in a rectangle. Herein, the rectangular arrangement means that connecting lines between geometric centers of the four sub-light-emitting chips 2 form a rectangle. The four sub-light-emitting chips 2 are connected in series to form a series group 100 of sub-light-emitting chips. The light-emitting chip further includes a first electrode 5 and a second electrode 6, wherein the first electrode 5 is connected to a sub-light-emitting chip 2 at a first terminal of the series group 100 of sub-light-emitting chips and the second electrode 6 is connected to a sub-light-emitting chip 2 at a second terminal of the series group 100 of sub-light-emitting chips. According to the embodiment of the disclosure, the triangular sub-light-emitting chips can increase an area of the light-emitting layer, improve the light-emitting efficiency of the light-emitting chip, shorten lengths of the series electrodes, improve heat dissipation performance of the chips, and reduces the risk of leakage.

In some embodiments, the sub-light-emitting chips may have other shapes, such as rhombus, pentagon, hexagon and other regular or irregular shapes, which will not be described in detail herein.

Figure 11:
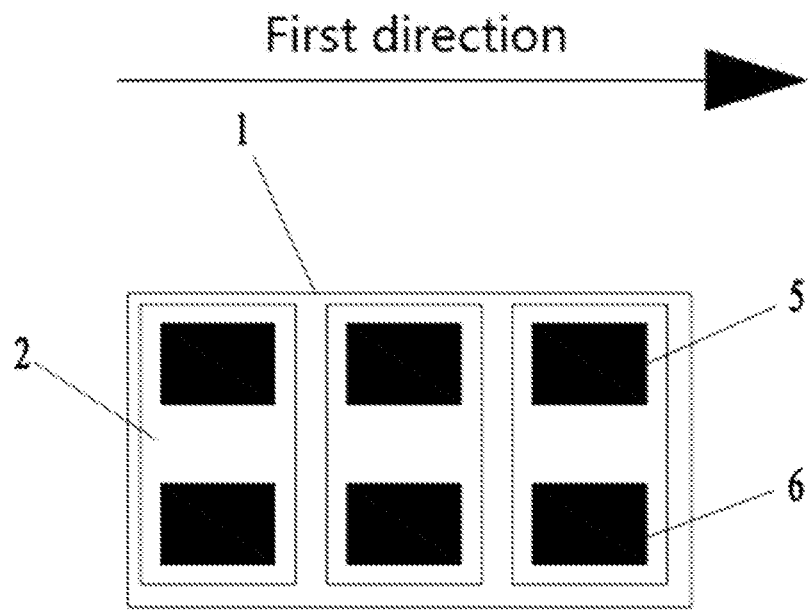
FIG. 11 is an eighth schematic diagram of a structure of a light-emitting chip according to an embodiment of the present disclosure.

FIG. 11 is an eighth schematic diagram of a structure of a light-emitting chip according to an embodiment of the present disclosure. As shown in FIG. 11, the light-emitting chip of the embodiment of the present disclosure includes a base substrate 1 and three sub-light-emitting chips 2 disposed on a side of the base substrate 1. In a direction parallel to the base substrate 1, the sub-light-emitting chips 2 are rectangular and have a same size. Exemplarily, the rectangle includes an approximate rectangle, for example, a rectangle with rounded corners. The three sub-light-emitting chips 2 are arranged side by side along a first direction of the base substrate 1. Each sub-light-emitting chip 2 includes a first electrode 5 and a second electrode 6, wherein the first electrode 5 is connected to the first semiconductor layer of the sub-light-emitting chip 2 and the second electrode 6 is connected to the second semiconductor layer of the sub-light-emitting chip 2.

The present disclosure provides a light-emitting substrate, which includes a drive back plate and the light-emitting chip of any of the above embodiments disposed on a side of the drive back plate. The light-emitting substrate may be used as a back light source of a display device such as a liquid crystal display panel, a liquid crystal television, a liquid crystal display, a mobile phone, a tablet, etc.

Figure 12:
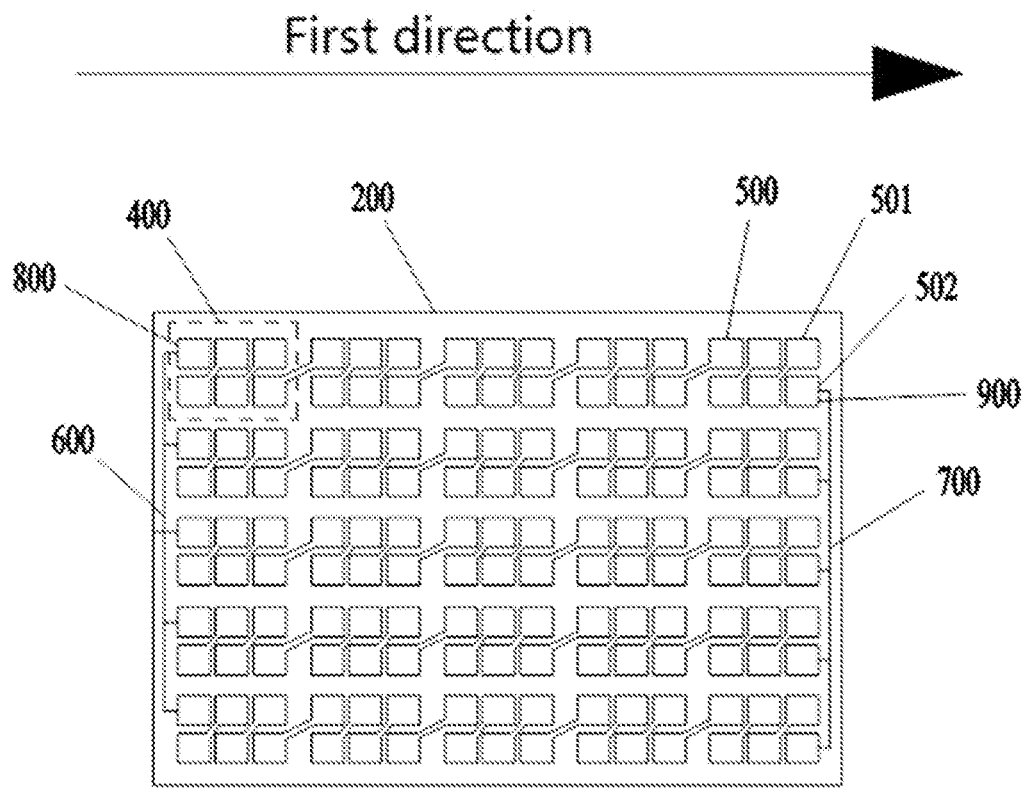
FIG. 12 is a schematic diagram of a structure of a drive back plate in a light-emitting substrate according to an embodiment of the present disclosure.
Figure 13:
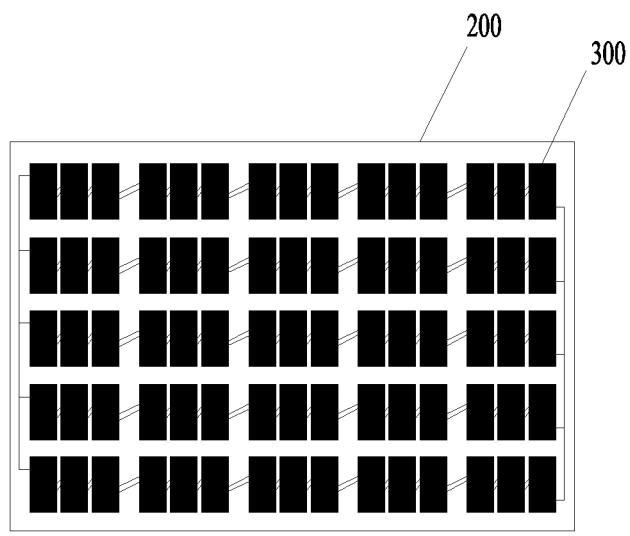
FIG. 13 is a schematic diagram of a structure of a light-emitting substrate according to an embodiment of the present disclosure.

FIG. 12 is a schematic diagram of a structure of a drive back plate in a light-emitting substrate according to an embodiment of the present disclosure. FIG. 13 is a schematic diagram of a structure of a light-emitting substrate according to an embodiment of the present disclosure. As shown in FIG. 12 and FIG. 13, the light-emitting substrate of the embodiment of the present disclosure includes a drive back plate 200 and light-emitting chips 300 disposed on a side of the drive back plate 200, as shown in FIG. 11. The drive back plate 200 is provided thereon with pad units 400, the pad unit 400 includes multiple pad groups 500 connected in series, wherein the light-emitting chips 300 are in one-to-one correspondence with the pad units 400. The sub-light-emitting chips of the light-emitting chip 300 are in one-to-one correspondence with the pad groups 500, and the sub-light-emitting chips of the light-emitting chip 300 are connected to the pad groups 500.

As shown in FIG. 12 and FIG. 13, a pad group 500 includes a first pad 501 and a second pad 502 which are oppositely disposed and insulated from each other. A first electrode 5 in a sub-light-emitting chip is connected to the first pad 501, and a second electrode 6 in the sub-light-emitting chip is connected to the second pad 502.

In an exemplary embodiment, the pad units 400 are arranged side by side along a first direction of the drive back plate 200 to form a pad unit row, and adjacent pad units 400 in the pad unit row are connected in series. That is, the second pad 502 of one of adjacent pad units 400 is connected to the first pad 501 of the other one of the adjacent pad units 400. Or, the first pad 501 of one of adjacent pad units 400 is connected to the second pad 502 of the other one of the adjacent pad units 400.

In the embodiment of the disclosure, the sub-light-emitting chips in the light-emitting chip 300 are connected in series through a drive back plate of the light-emitting substrate, which reduces difficulty of manufacturing processes of the light-emitting chip 300, improves manufacturing yield of the light-emitting chip, and reduces costs.

In an exemplary embodiment, the drive back plate 200 is provided thereon with a first lead 600 and a second lead 700, wherein the first lead 600 is connected to a pad unit 400 at a first terminal 800 of the pad unit row and the second lead 700 is connected to a pad unit 400 at a second terminal 900 of the pad group row. For example, the first lead 600 is connected to the first pad 501 in the pad unit 400 at the first terminal of the pad unit row, and the second lead 700 is connected to the second pad 502 in the pad unit 400 at the second terminal of the pad group row.

The first lead 600 and the second lead 700 are configured to supply a voltage to the pad group row, so that the light-emitting chip 300 on each pad unit in the pad group row emits light.

A manufacturing process of the light-emitting chip of the embodiment of the disclosure includes:

Step 1: sequentially growing and forming a first semiconductor thin film layer, a light-emitting thin film layer and a second semiconductor thin film layer on a base substrate by metal organic chemical vapor deposition (MOCVD) process, wherein the base substrate may be a Sapphire substrate.

Step 2: etching the first semiconductor thin film layer, the light-emitting thin film layer and the second semiconductor thin film layer to form at least two sub-light-emitting chips, wherein each sub-light-emitting chip includes a first semiconductor layer, a light-emitting layer and a second semiconductor layer which are stacked. The sub-light-emitting chip is provided with an upper step surface and a lower step surface, at least part of a surface of the first semiconductor layer in the sub-light-emitting chip away from the base substrate forms the lower step surface, and at least part of a surface of the second semiconductor layer in the sub-light-emitting chip away from the base substrate forms the upper step surface. The first semiconductor layer may be an N-type semiconductor layer, and the second semiconductor layer may be a P-type semiconductor layer.

Step 3: forming a first insulating layer 8 on a side of the first semiconductor layer 3 of the sub-light-emitting chip away from the base substrate, and depositing a conductive thin film, for example, the conductive thin film may be a metal thin film. Making the conductive thin film form a series electrode, wherein a first terminal 701 of a series electrode 7 is connected to the first semiconductor layer 3 of one of adjacent sub-light-emitting chips 2, a second terminal 702 of the series electrode 7 is connected to a second semiconductor layer 4 of the other one of the adjacent sub-light-emitting chips 2, and the first insulating layer 8 is configured to separate the second terminal 702 of the series electrode 7 from the first semiconductor layer 3 of the other one of the adjacent sub-light-emitting chips, as shown in FIG. 7.

In the description of the present disclosure, it should be understood that an orientation or positional relation indicated by the terms "middle", "upper", "lower", "front", "rear", "vertical", "horizontal", "top", "bottom", "inner", "outer" and the like is based on the orientation or positional relation shown in the accompanying drawings, which is only for the convenience of describing the present disclosure and simplifying the description, rather than indicating or implying that the device or element referred to must have the specific orientation, or be constructed and operated in the specific orientation, and thus cannot be interpreted as a limitation on the present disclosure.

In the description of the embodiments of the present disclosure, it should be noted that unless otherwise clearly specified and defined, the terms "install", "couple", "connect" should be broadly interpreted, for example, a connection may be a fixed connection, or a detachable connection, or an integrated connection; it may be a mechanical connection or an electrical connection; it may be a direct connection, or may be an indirect connection through an intermediary, or may be an internal connection between two elements. Those of ordinary skill in the art may understand the meanings of the terms in the present disclosure according to specific situations.

Although the embodiments disclosed in the present disclosure are as described above, the content described is only the embodiments used to facilitate the understanding of the present disclosure, and is not intended to limit the present disclosure. Anyone skilled in the art to which the present disclosure belongs can make any modifications and changes in the implementation forms and details without departing from the spirit and scope disclosed in the present disclosure. However, the scope of patent protection of the present disclosure is still subject to the scope defined by the appended claims.

What is claimed is:

1. A light-emitting chip, comprising: a base substrate and at least two sub-light-emitting chips disposed on a side of the base substrate, wherein each sub-light-emitting chip comprises a first semiconductor layer, a second semiconductor layer and a light-emitting layer located between the first semiconductor layer and the second semiconductor layer, which are stacked;

wherein the at least two sub-light-emitting chips are connected in series to form a series group of sub-light-emitting chips, and the light-emitting chip further comprises a first electrode and a second electrode, the first electrode is connected to a sub-light-emitting chip at a first terminal of the series group of sub-light-emitting chips and the second electrode is connected to a sub-light-emitting chip at a second terminal of the series group of sub-light-emitting chips;

wherein in a direction perpendicular to the base substrate, the first electrode and the second electrode are located on a side of the second semiconductor layer away from the light-emitting layer, and a second insulating layer is disposed between the first and second electrodes and the second semiconductor layer; the second insulating layer is provided with a first via hole exposing a sub-light-emitting chip at the first terminal of the series group of sub-light-emitting chips and a second via hole exposing a sub-light-emitting chip at the second terminal of the series group of sub-light-emitting chips; the first electrode is connected to the sub-light-emitting chip at the first terminal of the series group of sub-light-emitting chips through the first via hole, and the second electrode is connected to the sub-light-emitting chip at the second terminal of the series group of sub-light-emitting chips through the second via hole.

2. The light-emitting chip according to claim 1, wherein a vertical projection of any one of the sub-light-emitting chips in the series group of sub-light-emitting chips on the base substrate overlaps with a vertical projection of at least one of the first electrode and the second electrode on the base substrate.

3. The light-emitting chip according to claim 1, wherein in a direction parallel to the base substrate, the sub-light-emitting chips in the series group of sub-light-emitting chips are arranged side by side along a first direction of the base substrate; or, the sub-light-emitting chips are arranged in a triangle; or, the sub-light-emitting chips are disposed in a rectangle.

4. The light-emitting chip according to claim 1, further comprising a series electrode disposed on a side of the base substrate, wherein a first terminal of the series electrode is connected to the first semiconductor layer of one of adjacent sub-light-emitting chips, and a second terminal of the series electrode is connected to the second semiconductor layer of the other one of the adjacent sub-light-emitting chips.

5. The light-emitting chip according to claim 4, wherein in a direction perpendicular to the base substrate, a first insulating layer is disposed between the first terminal of the series electrode and the second semiconductor layer of one of the adjacent sub-light-emitting chips; and/or the first insulating layer is disposed between the second terminal of the series electrode and the first semiconductor layer of the other one of the adjacent sub-light-emitting chips.

6. The light-emitting chip according to claim 1, wherein the second insulating layer is made of a reflective material.

7. The light-emitting chip according to claim 1, wherein the sub-light-emitting chips are rectangular or triangular.

8. A light-emitting substrate, comprising: a drive back plate and a light-emitting chip disposed on a side of the drive back plate, wherein the light-emitting chip is the light-emitting chip according to claim 1.

9. The light-emitting substrate according to claim 8, wherein a vertical projection of any one of the sub-light-emitting chips in the series group of sub-light-emitting chips on the base substrate overlaps with a vertical projection of at least one of the first electrode and the second electrode on the base substrate.

10. The light-emitting substrate according to claim 8, wherein in a direction parallel to the base substrate, the sub-light-emitting chips in the series group of sub-light-emitting chips are arranged side by side along a first direction of the base substrate; or, the sub-light-emitting chips are arranged in a triangle; or, the sub-light-emitting chips are disposed in a rectangle.

11. The light-emitting substrate according to claim 8, further comprising a series electrode disposed on a side of the base substrate, wherein a first terminal of the series electrode is connected to the first semiconductor layer of one of adjacent sub-light-emitting chips, and a second terminal of the series electrode is connected to the second semiconductor layer of the other one of the adjacent sub-light-emitting chips.

12. The light-emitting substrate according to claim 8, wherein in a direction perpendicular to the base substrate, the first electrode and the second electrode are located on a side of the second semiconductor layer away from the light-emitting layer, and a second insulating layer is disposed between the first and second electrodes and the second semiconductor layer; the second insulating layer is provided with a first via hole exposing the sub-light-emitting chip at the first terminal of the series group of sub-light-emitting chips and a second via hole exposing the sub-light-emitting chip at the second terminal of the series group of sub-light-emitting chips; the first electrode is connected to the sub-light-emitting chip at the first terminal of the series group of sub-light-emitting chips through the first via hole, and the second electrode is connected to the sub-light-emitting chip at the second terminal of the series group of sub-light-emitting chips through the second via hole.

* * * * *